(12) United States Patent
Weaver

(10) Patent No.: US 11,926,157 B2
(45) Date of Patent: Mar. 12, 2024

(54) PHOTORESIST IMAGING AND DEVELOPMENT FOR ENHANCED NOZZLE PLATE ADHESION

(71) Applicant: FUNAI ELECTRIC CO., LTD, Osaka (JP)

(72) Inventor: Sean T. Weaver, Lexington, KY (US)

(73) Assignee: Funai Electric Co., Ltd. (JP)

( * ) Notice: Subject to any disclaimer, the term of this patent is extended or adjusted under 35 U.S.C. 154(b) by 398 days.

(21) Appl. No.: 17/193,731

(22) Filed: Mar. 5, 2021

(65) Prior Publication Data
US 2022/0281224 A1    Sep. 8, 2022

(51) Int. Cl.
| | | |
|---|---|---|
| B41J 2/16 | (2006.01) | |
| B41J 2/14 | (2006.01) | |
| G03F 7/038 | (2006.01) | |
| G03F 7/075 | (2006.01) | |
| G03F 7/16 | (2006.01) | |
| G03F 7/20 | (2006.01) | |

(52) U.S. Cl.
CPC ........... B41J 2/1623 (2013.01); B41J 2/1433 (2013.01); B41J 2/1628 (2013.01); B41J 2/1631 (2013.01); G03F 7/0382 (2013.01); G03F 7/0751 (2013.01); G03F 7/0752 (2013.01); G03F 7/162 (2013.01); G03F 7/2004 (2013.01); B41J 2202/19 (2013.01); B41J 2202/22 (2013.01)

(58) Field of Classification Search
CPC ...... B41J 2/1623; B41J 2/1639; B41J 2/1631; B41J 2/1603; B41J 2/1433; B41J 2/1628; B41J 2/1626; B41J 2202/19; B41J 2202/22; G03F 7/0752; G03F 7/0382; G03F 7/2004; G03F 7/0751; G03F 7/162
See application file for complete search history.

(56) References Cited

U.S. PATENT DOCUMENTS

| | | | |
|---|---|---|---|
| 6,409,312 | B1 | 6/2002 | Mrvos et al. |
| 7,165,831 | B2 | 1/2007 | Cornell et al. |
| 7,503,114 | B2 | 3/2009 | Tokunaga et al. |
| 7,954,927 | B2 | 6/2011 | Hart et al. |
| 8,079,669 | B2 | 12/2011 | Silverbrook |
| 8,430,484 | B2 | 4/2013 | Fang |
| 9,101,954 | B2 | 8/2015 | Wang et al. |
| 9,855,566 | B1 * | 1/2018 | Craft ...................... B41J 2/1628 |
| 10,525,707 | B2 | 1/2020 | Nakayama et al. |
| 2014/0218437 | A1 | 8/2014 | Ciampini et al. |

* cited by examiner

*Primary Examiner* — An H Do
(74) *Attorney, Agent, or Firm* — Luedeka Neely, P.C.

(57) ABSTRACT

A fluid ejection head for a fluid jet ejection device and a method for improving adhesion between a nozzle plate and a flow feature layer of the ejection head. The fluid ejection head includes a silicon substrate containing at least one array of fluid ejectors deposited thereon. At least one fluid supply via is etched through the silicon substrate adjacent to the at array of fluid ejectors. A flow feature layer is attached to the silicon substrate. The flow feature layer contains at fluid chambers and fluid flow channels corresponding the array of fluid ejectors for ejecting fluid provide fluid from the at least one fluid supply via to fluid chambers. At least a portion of the flow feature layer comprises an attachment surface having improved surface adhesion characteristics, and a nozzle plate containing nozzle holes is laminated to the flow feature layer to provide the fluid ejection head.

6 Claims, 6 Drawing Sheets

PHOTORESIST IMAGING AND DEVELOPMENT FOR ENHANCED NOZZLE PLATE ADHESION

TECHNICAL FIELD

The disclosure relates to improved fluid ejection heads and in particular to methods for improving adhesion of a nozzle plate to a flow feature layer of a fluid ejection head.

BACKGROUND AND SUMMARY

Fluid jet ejection heads are used in a wide variety of application including, but not limited to, ink jet ejection heads, digital fluid dispensing devices, and pharmaceutical jet spray devices. Primary components of the fluid jet ejection heads include micro-electro-mechanical (MEMS) devices that is made from a silicon substrate and have metal and non-metal layers deposited thereon to provide electrically activated fluid ejectors. The fluid ejectors may be thermal fluid ejectors, bubble jet ejectors, or piezoelectric ejectors. A flow feature layer is applied to the MEMS device to direct fluid from a supply cartridge to the fluid ejectors. The flow feature layer includes fluid flow channels to direct fluid from a fluid supply via in the silicon substrate to fluid chambers containing the fluid ejectors. A nozzle plate is attached to the flow feature layer to provide ejection nozzles for ejecting fluid from the ejection head upon activation of the fluid ejectors.

An area of the construction of the fluid jet ejection heads that remains problematic is the adhesion of the nozzle plate to the flow feature layer of the ejection head. Some surface areas of the flow feature layer to which the nozzle plate is attached are narrow and relatively smooth. A conventional method for attaching the nozzle plate to the flow feature layer is to laminate the nozzle plate to the flow feature layer after treating the exposed surface of the flow feature layer with oxygen plasma and coating the exposed surface with silane. However, even with oxygen plasma and the silane coating, adhesion of the nozzle plate to the narrow surface areas of the flow feature layer remains problematic. Furthermore, the steps of oxygen plasma treatment and silane coating of the flow feature layer are time consuming processes that increase production time and decrease production throughput. Accordingly, what is needed is a method for improving adhesion of the nozzle plate to the flow feature layer which does not adversely affect production time, and which is more cost effective to implement.

Accordingly, an embodiment of the disclosure provides a fluid ejection head for a fluid jet ejection device. The fluid ejection head includes a silicon substrate containing at least one array of fluid ejectors deposited thereon. At least one fluid supply via is etched through the silicon substrate adjacent to the at least one array of fluid ejectors. A flow feature layer is attached to the silicon substrate. The flow feature layer contains at least one array of fluid chambers and fluid flow channels corresponding the at least one array of fluid ejectors for ejecting fluid provide fluid from the at least one fluid supply via to fluid chambers. At least a portion of the flow feature layer has an attachment surface having improved surface adhesion characteristics. A nozzle plate containing nozzle holes is laminated to the flow feature layer to provide the fluid ejection head.

In another embodiment there is provided a method for improving adhesion of a nozzle plate to a flow feature layer of a fluid ejection head. The method includes providing a silicon substrate having a device surface containing at least one array of fluid ejectors thereon. A photoresist material is spin-coated onto the device surface of the silicon substrate. The photoresist material is exposed to actinic radiation through a mask to provide the flow feature layer. The mask contains opaque areas defining a plurality of fluid flow channels and fluid chambers in the photoresist material and mask areas adjacent to the plurality of fluid flow channels and fluid chambers that provide improved surface adhesion characteristics surface area for increased adhesion between a developed surface of the photoresist material and a nozzle plate attached to the photoresist material.

Another embodiment of the disclosure provides a method for making a fluid jet ejection head. The method includes providing a silicon substrate having a device surface containing at least one array of fluid ejectors thereon. A photoresist material is spin-coated onto the device surface of the silicon substrate. The photoresist material is exposed to actinic radiation through a mask to provide a flow feature layer. The mask contains opaque areas defining a plurality of fluid flow channels and fluid chambers in the photoresist material and mask areas adjacent to the plurality of fluid flow channels and fluid chambers that that provide a surface area with improved surface adhesion characteristics for increased adhesion between a developed surface of the photoresist material and a nozzle plate attached to the photoresist material. A fluid supply via is etched in the silicon substrate. The photoresist material is developed to provide the plurality of fluid flow channels and fluid chambers therein and areas of improved surface adhesion characteristics. A nozzle plate is attached to the surface of the flow feature layer.

In some embodiments, the flow feature layer comprises a negative photoresist material spin coated onto the silicon substrate.

In some embodiments, the flow feature layer is imaged through a mask containing opaque areas and gray scale areas, wherein the gray scale areas provide a roughened attachment surface having the improved surface adhesion characteristics.

In some embodiments, the flow feature layer is imaged through a mask containing opaque areas and areas containing chrome particles, wherein the areas containing chrome particles provide concavities on a portion of the surface of the flow feature layer whereby a surface area for attaching the nozzle plate to the flow feature layer has the improved surface adhesion characteristics.

In some embodiments, the flow feature layer is imaged through a mask containing opaque areas and areas containing opaque geometric shapes, wherein the areas containing opaque geometric shapes provide a surface of the flow feature layer whereby a surface area for attaching the nozzle plate to the flow feature layer has the improved surface adhesion characteristics.

In some embodiments, the mask areas adjacent to the plurality of fluid flow channels and fluid chambers contains gray scale areas that decrease an intensity of the actinic radiation by about 20 to about 50%.

In some embodiments, the photoreist material comprises a negative photoresist material.

In some embodiments, the nozzle plate is laminated to the surface of the flow feature layer in the absence of oxygen plasma treatment of the increased surface area of the flow feature layer.

Advantages of the disclosed embodiments include, but are not limited to, improved adhesion of the nozzle plate to the flow feature layer, reduced ejection head processing time, reduced ejection head costs, and other benefits and advantages. The embodiments may be implemented without increasing the process steps required to fabricate ejection heads for fluid ejection devices. In some embodiments, process steps of oxygen plasma treatment of an exposed surface of the flow feature layer and coating with a silane adhesion agent may be eliminated.

DETAILED DESCRIPTION

Figure 1:
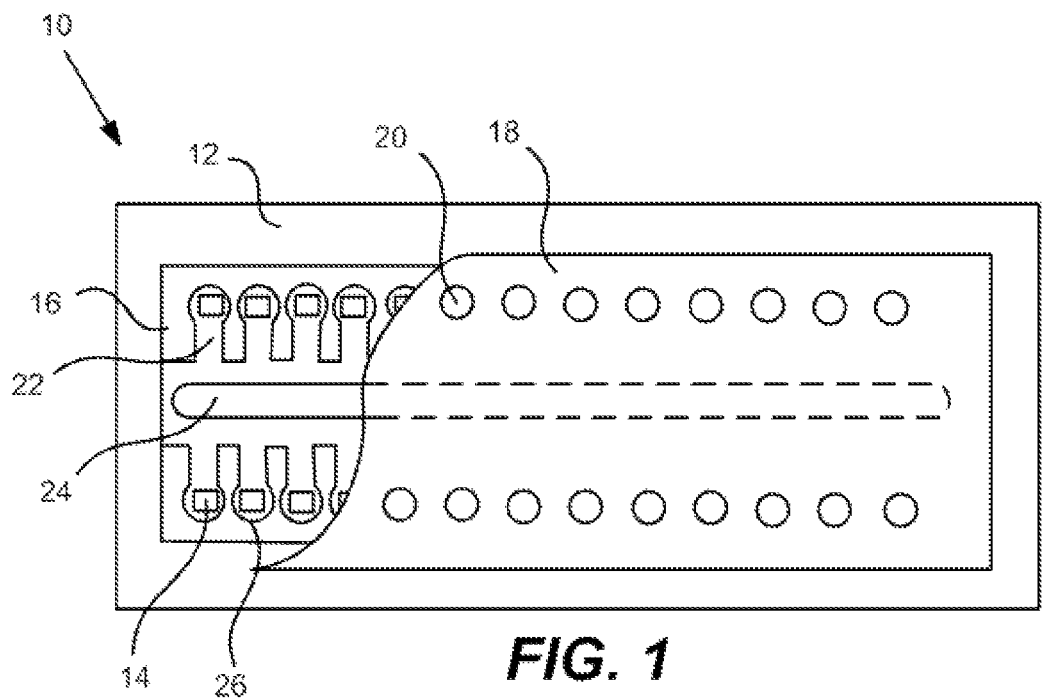
FIG. 1 is a plan, cut-away view, not to scale, of a prior art fluid ejection head for a fluid ejection device.

With reference to FIGS. 1-5, there are shown simplified representations of portions of a prior art ejection head 10 containing a semiconductor substrate 12, fluid ejectors 14, a flow feature layer 16, and a nozzle plate 18 containing nozzle holes 20 therein. The flow feature layer 16 includes fluid channels 22 leading from a fluid supply via 24 in the semiconductor substrate to a fluid chamber 26 containing the fluid ejectors 14. The semiconductor substrate 12 is preferably a silicon semiconductor substrate 12 containing a plurality of fluid ejectors 14 such as piezoelectric devices or heater resistors formed on a device side 28 of the substrate 12 as shown in the simplified illustration of FIG. 3. Fluid supplied through one or more fluid supply vias 24 in the semiconductor substrate 12 flows through the fluid supply channel 22 to a fluid chamber 26 formed in the flow feature layer 16 where the fluid is caused to be ejected through a nozzle hole 20 in the nozzle plate 18 when the fluid ejector 14 is activated.

Figure 3:
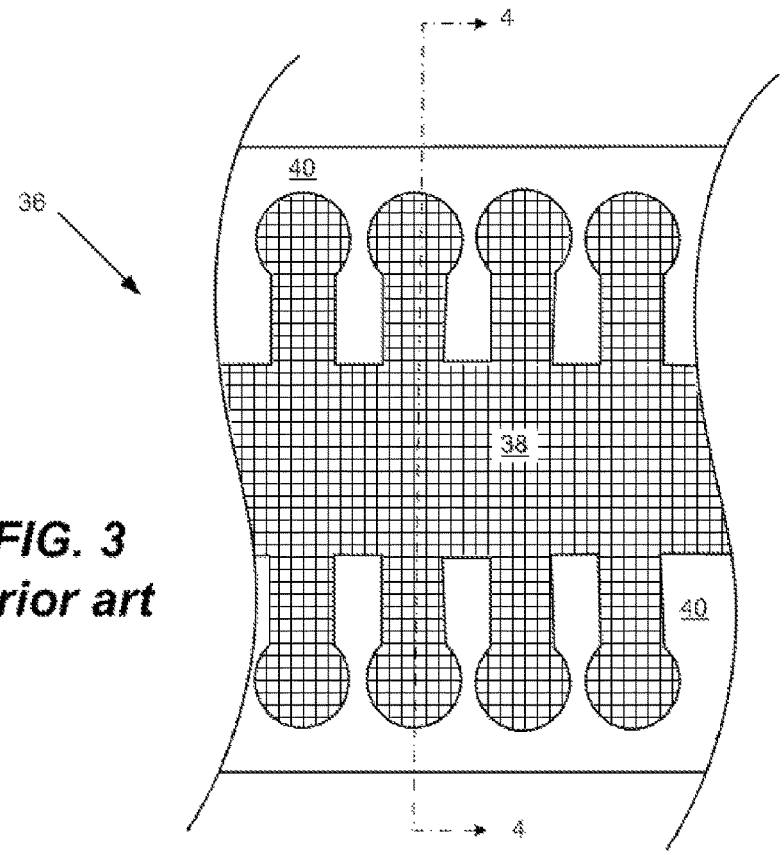
FIG. 3 is a plan view, not to scale, of a portion of a prior art mask used for forming fluid flow channels and fluid chambers in a flow feature layer of the ejection head of FIG. 1.
Figure 4:
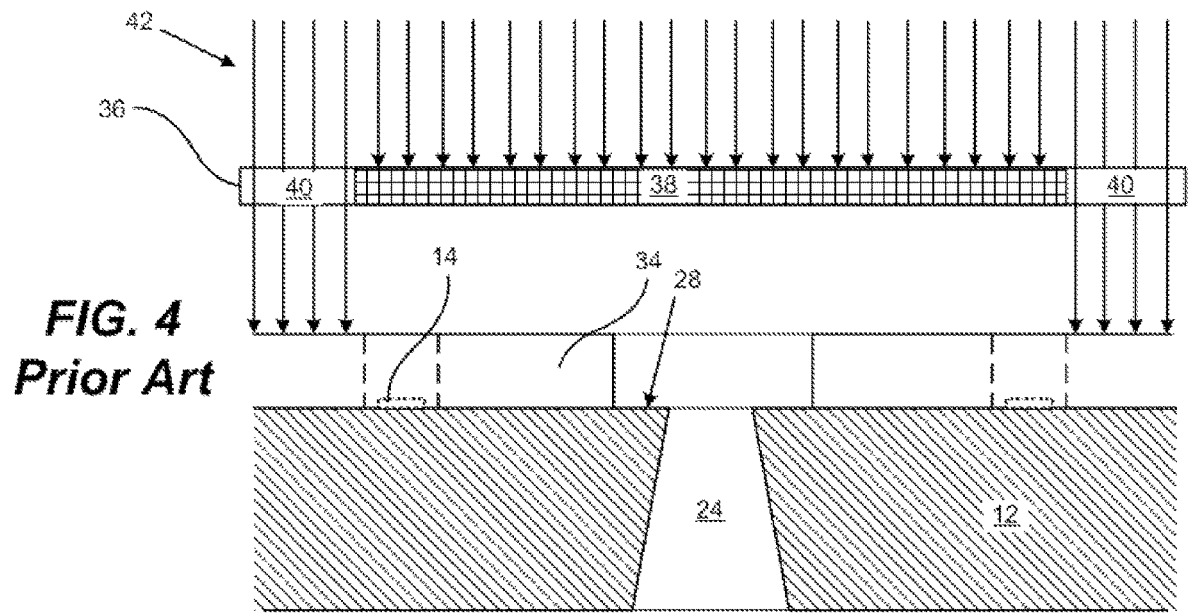
FIG. 4 is a schematic illustration, not to scale, of an imaging process for the flow feature layer of the fluid ejection head of FIG. 1.
Figure 5:
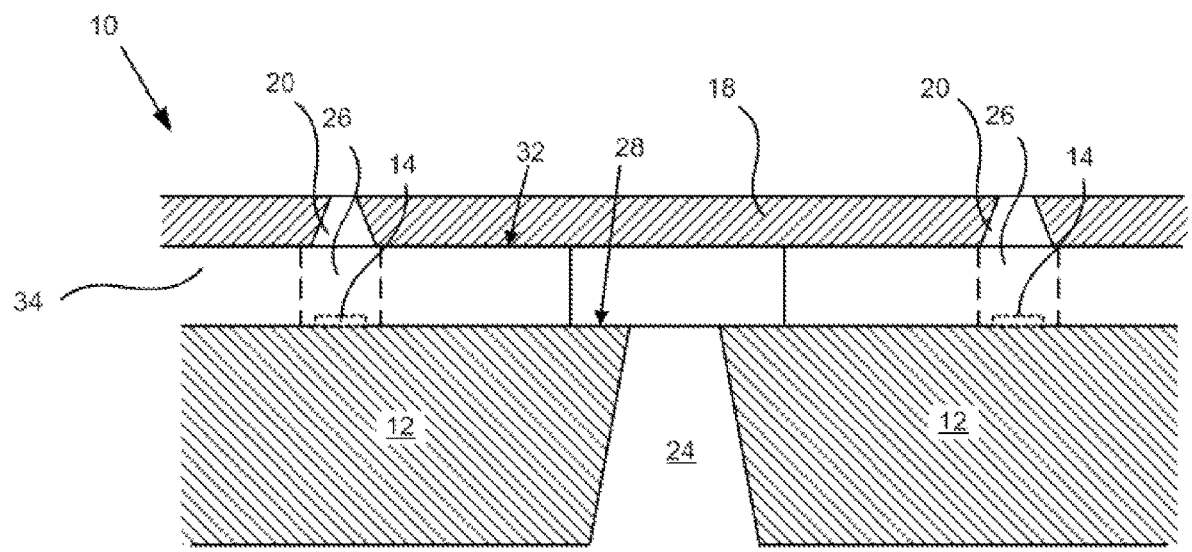
FIG. 5 is a cross-sectional, not to scale, of a portion of the prior art fluid ejection head of FIG. 1 prior to developing the thick film layer and nozzle plate.
Figure 6:
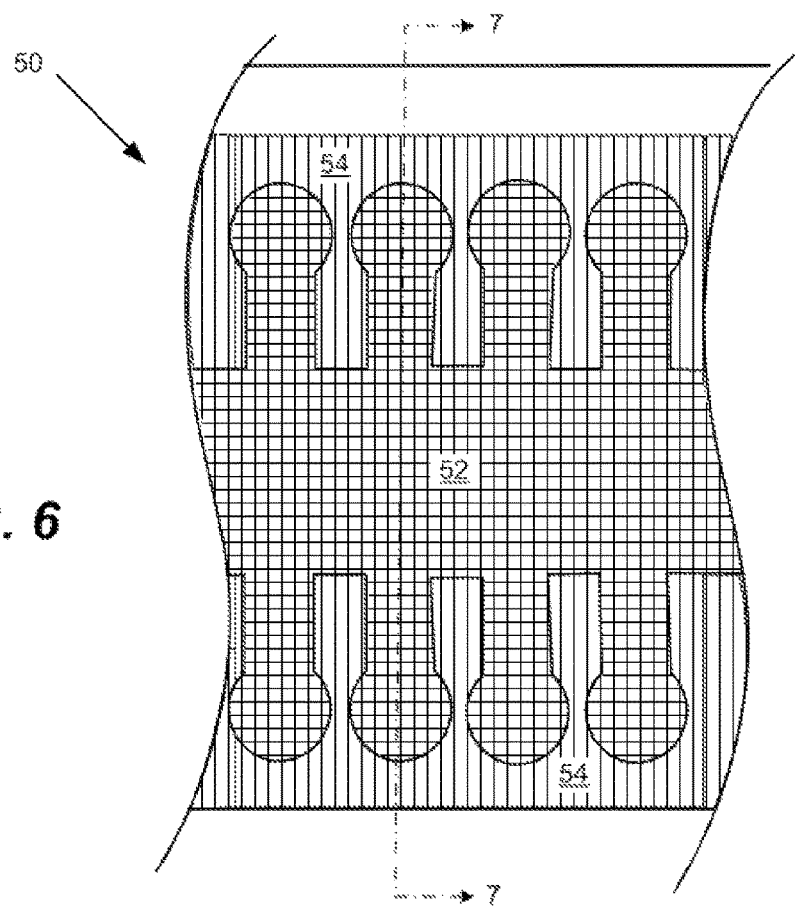
FIG. 6 is a mask, not to scale, containing gray-scale areas for forming a flow feature layer of an ejection head according to a first embodiment of the disclosure.
Figure 7:
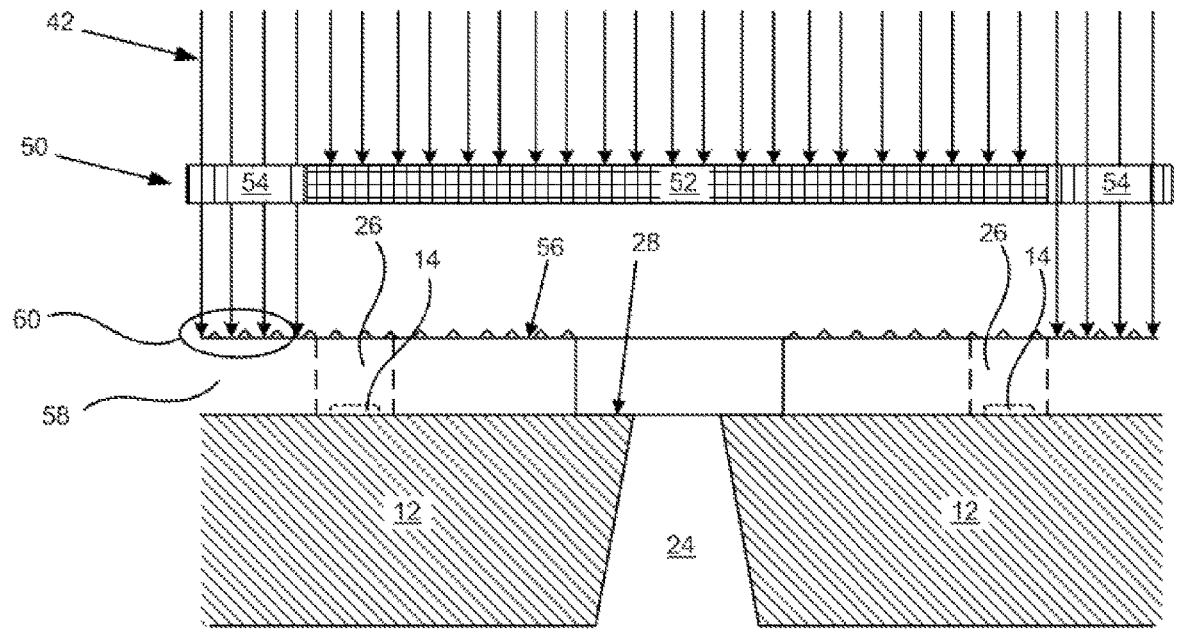
FIG. 7 is a schematic illustration, not to scale, of an imaging process for the flow feature layer using the mask of FIG. 6.

FIGS. 3-5 illustrate a mask and method for forming the prior art flow feature layer 16 on the semiconductor substrate 12. Prior to forming the flow feature layer 16 on the substrate 12, the substrate 12 is etched using a deep reactive ion etching (DRIE) process to form one or more fluid supply vias 24 therein. Next a thick film layer 34 is applied to the substrate 12 by dry laminating or spin coating the thick film layer 34 onto the device surface 28 of the substrate 12. The device surface of the substrate may be prepared to promote adhesion between the substrate 12 and the thick film layer 34 by plasma treating the device surface 28 with oxygen and/or silane before laminating or spin coating the thick film layer 34 onto the substrate 12. Silane compounds that are compatible with the components of the photoresist formulation typically have a functional group capable of reacting with at least one member selected from the group consisting of a multifunctional epoxy compound, a difunctional epoxy compound and a photoinitiator. Such an adhesion enhancing agent may be a silane with an epoxide functional group such as a glycidoxy-alkyltrialkoxysilane, e.g., gamma-glycidoxy-propyltrimethoxysilane. When used, the adhesion enhancing agent is preferably present in an amount ranging from about 0.5 to about 2 weight percent and preferably from about 1.0 to about 1.5 weight percent based on total weight of the cured resin, including all ranges subsumed therein. Adhesion enhancing agents, as used herein, are defined to mean organic materials soluble in the photoresist composition which assist the film forming and adhesion characteristics of the thick film layer 34 on the device surface 28 of the substrate 12.

The thick film layer 34 is then exposed to UV radiation 42 through a mask 36 having an opaque area 38 and a transparent area 40 as shown in FIGS. 4 and 5. The thick film layer 34 is heated to cross-link the UV exposed areas of the thick film layer 34 under the transparent areas 40 of the mask 36. The thick film layer 34 is not developed at this stage of the process.

In the next step of the process, the nozzle plate 18 is laminated to the exposed and undeveloped thick film layer 34 using a compression roll laminator. Adhesion may be promoted between the thick film layer 34 and the nozzle plate 18 by treating the surface 32 of the thick film layer 34 with oxygen plasma and a forming gas and/or silane.

In order to provide nozzle holes 20 in the nozzle plate 18, the nozzle plate 18 is exposed to UV radiation through a mask, having opaque areas corresponding to nozzle hole areas. After exposing the nozzle plate 18 to UV radiation, the nozzle plate 18 and thick film layer 34 are developed simultaneously using a photoresist developer. The substrate 12 containing the exposed thick film layer 34 and nozzle plate 18 is placed in a developer bath using megasonic agitation to dissolve the uncross-linked materials in both the thick film layer 34 and nozzle plate 18 so that the un-crosslinked material from the thick film layer 34 is dissolved through the previously formed via 24 and the un-crosslinked material from the nozzle plate 18 is dissolved through nozzle holes 20 in the nozzle plate 18. Illustrative developers used in the developer bath include, for example, butyl cellosolve acetate, cyclohexanone, methyl ethyl ketone, a xylene and butyl cellosolve acetate mixture, and $C_{1-6}$ acetates like butyl acetate, or a combination of two or more of the foregoing.

Figure 2:
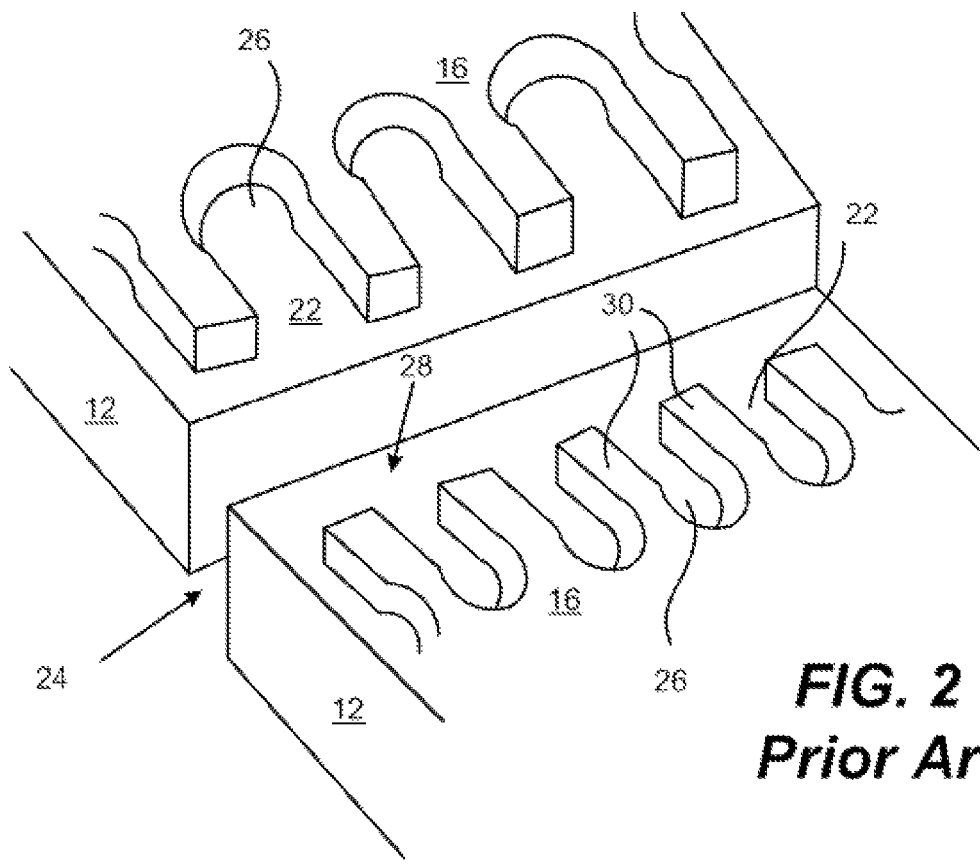
FIG. 2 is a perspective view, not to scale, of a portion of a semiconductor substrate containing a fluid via therein and a fluid flow layer attached to the substrate.

As seen in FIG. 2, the flow feature layer 16 has elongate, relatively narrow fingers 30 that form the fluid channels 22 leading to the fluid chambers 26. Since the surface 32 of the flow feature layer 16 to which the nozzle plate 18 is attached is narrow in the area of the fingers 30, there is often adhesion failure between the nozzle plate 18 and the flow feature layer 16 in the area of the fingers 30.

With reference to FIGS. 6-11, imaging masks and methods for improving the adhesion between a nozzle plate and a flow feature layer are illustrated. In a first embodiment, (FIGS. 6-8), a mask 50 having opaque areas 52 and gray scale areas 54 is used to provide a roughened surface 56 of a negative photoresist thick film layer 58. Gray scale photoimaging uses sub-resolution pixels on the surface of the mask. The sub-resolution pixels manipulate the actinic light source by means of attenuating the overall light intensity for initiating a chemical reaction in the photoresist material of the thick film layer 58. The result of attenuating the light intensity is that small features are formed on the surface 56 of the thick film layer 58 that increase the surface area of the surface 56 of the thick film layer. In some embodiments, the gray scale areas of the mask 50 reduce transmission of ultraviolet light 42 through the mask by up to 50% thereby reducing the amount of cross-linking of the negative photoresist material in the gray scale areas 54, particularly along the fingers 30, as described above.

Figure 8:
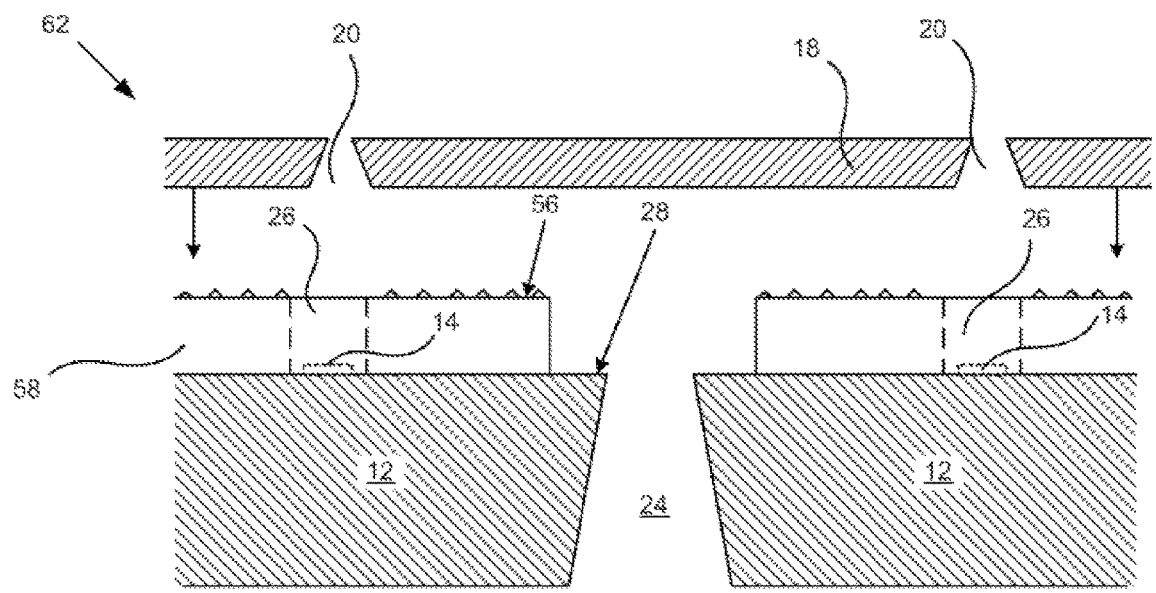
FIG. 8 is a cross-sectional view, not to scale, of a nozzle plate being attached to a surface of a flow feature layer made according to the imaging process of FIG. 7.

In FIG. 8, the nozzle plate 18 is heat laminated to the surface 56 of the thick film layer 58 using pressure and heat. The increased surface area greatly improves adhesion between the nozzle plate 18 and the thick film layer 58. The resulting ejection head 60 has improved adhesion of the nozzle plate 18 to the thick film layer 58 the area of the fingers 30 even in the absence of plasma surface treatment of the thick film layer 58 and coating the thick film layer with a silane adhesion agent.

Figure 9:
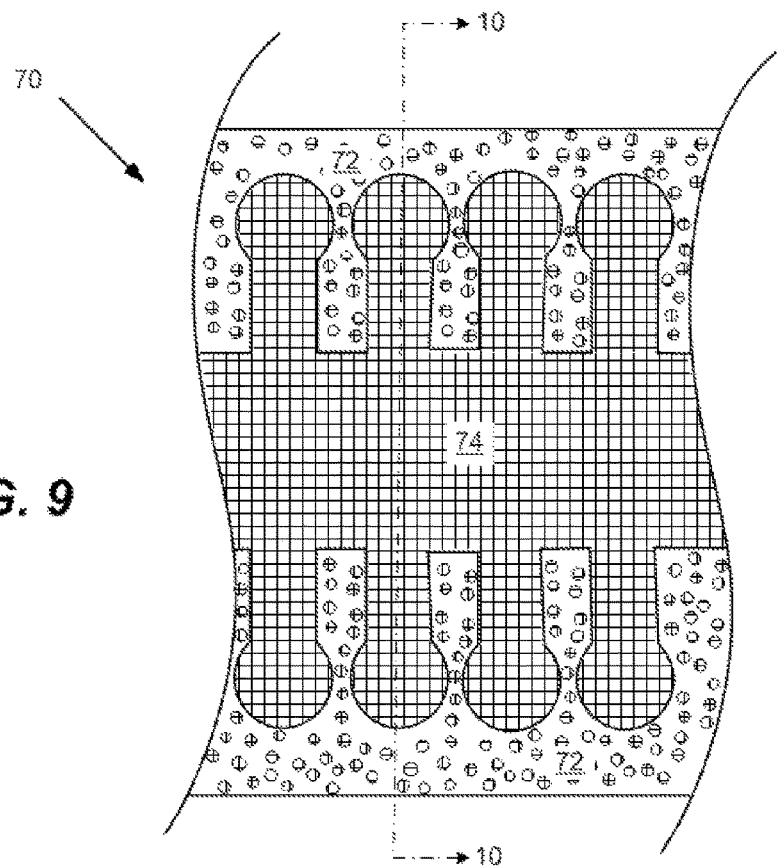
FIG. 9 is a mask, not to scale, containing opaque particles for forming a flow feature layer of an ejection head according to a second embodiment of the disclosure.
Figure 10:
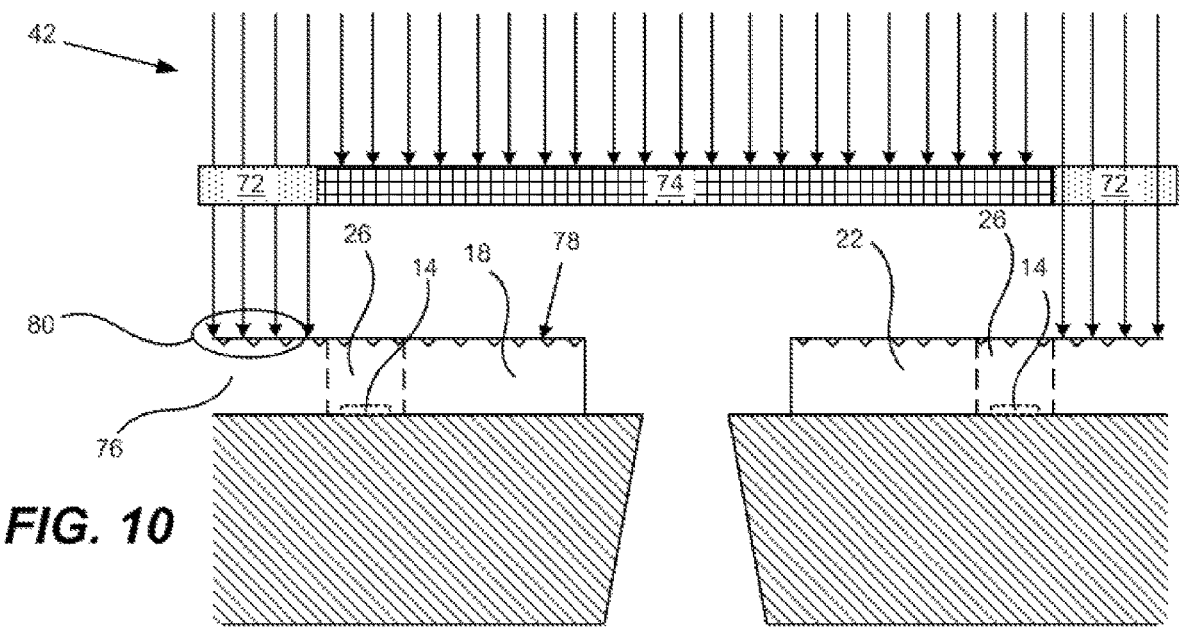
FIG. 10 is a schematic illustration, not to scale, of an imaging process for the flow feature layer using the mask of FIG. 8.

In another embodiment, illustrated in FIGS. 9-10, a mask 70 containing small solid metal particles such as chrome particles on the mask 70 are used as indicated by areas 72 while area 74 is opaque as with the other masks 36 and 50 described above. The opaque area 74 prevents crosslinking of the photoresist material in a thick film layer 76 in order to form the fluid channels 22 and fluid chambers 26. Likewise, the small metal particles prevent UV radiation from impacting on portions of the surface 78 of the thick film layer 76 causes such portions to remain un-crosslinked. When the thick film layer 76 is developed, the uncrosslinked areas form a plurality of concavities 80 in the surface 78 of the thick film layer 76. Like the previous embodiment, the concavities 80 provide an increase surface area for improved adhesion of the nozzle plate 18 to the thick film layer 76.

Figure 11:
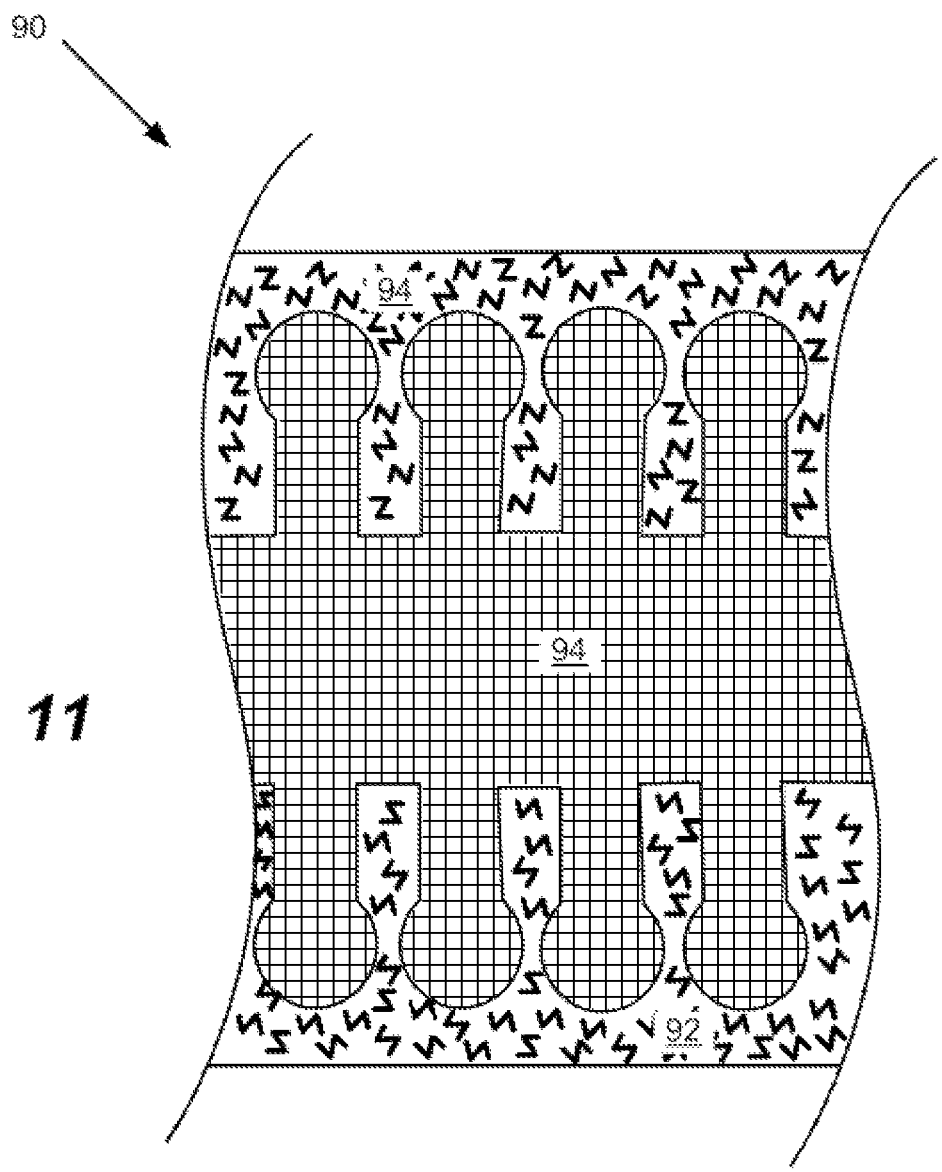
FIG. 11 is a mask, not to scale, containing opaque geometric shapes for forming a flow feature layer of an ejection head according to a third embodiment of the disclosure.

FIG. 11 illustrates a mask 90 according to another embodiment of the disclosure. According to this embodiment, the mask 90 includes a plurality of geometric-shaped opaque particles 92 that attenuate the radiation in order to form unresolved images on the surface of a thick film layer. Like the previous embodiment, the unresolved images on the surface of the thick film layer are removed during development of the thick film layer leaving geometric shapes on the surface which increase the surface area for increased mechanical interlocking between the nozzle plate and the thick film layer. The opaque areas 94 of the mask 90 provide the fluid channels 22 and fluid chambers 26 in the thick film layer. It will be appreciated that the plurality of geometric-shaped opaque particles can have a variety of shapes including, circles, triangles, rectangles, zig-zag lines, and the like.

Having described various aspects and exemplary embodiments and several advantages thereof, it will be recognized by those of ordinary skills that the disclosed embodiments is susceptible to various modifications, substitutions and revisions within the spirit and scope of the appended claims.

What is claimed is:

1. A fluid ejection head for a fluid jet ejection device comprising,
    a silicon substrate containing at least one array of fluid ejectors deposited thereon,
    at least one fluid supply via etched through the silicon substrate adjacent to the at least one array of fluid ejectors,
    a flow feature layer attached to the silicon substrate, the flow feature layer containing at least one array of fluid chambers and fluid flow channels corresponding the at least one array of fluid ejectors configured for ejecting fluid provide fluid from the at least one fluid supply via to fluid chambers, wherein at least a portion of the flow feature layer comprises an attachment surface having a roughened surface area with improved surface adhesion characteristics, and
    a nozzle plate containing nozzle holes laminated to the flow feature layer to provide the fluid ejection head.

2. The fluid ejection head of claim 1, wherein the flow feature layer comprises a negative photoresist material spin coated onto the silicon substrate.

3. The fluid ejection head of claim 1, wherein the flow feature layer comprises a negative photoresist material laminated to the silicon substrate.

4. The fluid ejection head of claim 2, wherein the flow feature layer is imaged through a mask containing opaque areas and gray scale areas, wherein the gray scale areas provide a roughened attachment surface configured to provide the roughened surface area having the improved surface adhesion characteristics.

5. The fluid ejection head of claim 2, wherein the flow feature layer is imaged through a mask containing opaque areas and areas containing chrome particles, wherein the areas containing chrome particles provide concavities on a portion of the surface of the flow feature layer whereby a surface area for attaching the nozzle plate to the flow feature layer has the roughened surface area that provides the improved surface adhesion characteristics.

6. The fluid ejection head of claim 2, wherein the flow feature layer is imaged through a mask containing opaque areas and areas containing opaque geometric shapes, wherein the areas containing opaque geometric shapes provide a surface of the flow feature layer whereby a surface area for attaching the nozzle plate to the flow feature layer has the roughened surface area that provides the improved surface adhesion characteristics.

* * * * *